United States Patent
Kono

(10) Patent No.: US 11,521,948 B2
(45) Date of Patent: Dec. 6, 2022

(54) METHOD OF MANUFACTURING SEMICONDUCTOR DEVICE

(71) Applicant: AOI Electronics Co., Ltd., Takamatsu (JP)

(72) Inventor: Ichiro Kono, Higashiyamato (JP)

(73) Assignee: AOI Electronics Co., Ltd., Takamatsu (JP)

( * ) Notice: Subject to any disclaimer, the term of this patent is extended or adjusted under 35 U.S.C. 154(b) by 0 days.

(21) Appl. No.: 16/967,480

(22) PCT Filed: Jan. 30, 2019

(86) PCT No.: PCT/JP2019/003169
§ 371 (c)(1),
(2) Date: Aug. 5, 2020

(87) PCT Pub. No.: WO2019/155959
PCT Pub. Date: Aug. 15, 2019

(65) Prior Publication Data
US 2021/0217719 A1  Jul. 15, 2021

(30) Foreign Application Priority Data
Feb. 6, 2018 (JP) .............................. JP2018-019434

(51) Int. Cl.
*H01L 23/00* (2006.01)
*H01L 21/683* (2006.01)
*H01L 21/78* (2006.01)

(52) U.S. Cl.
CPC .......... *H01L 24/19* (2013.01); *H01L 21/6835* (2013.01); *H01L 21/78* (2013.01);
(Continued)

(58) Field of Classification Search
CPC .............................. H01L 24/19; H01L 21/78
See application file for complete search history.

(56) References Cited

U.S. PATENT DOCUMENTS

2009/0151986 A1   6/2009  Mitsuzono
2017/0005044 A1*  1/2017  Ishido .................. H01L 23/562
(Continued)

FOREIGN PATENT DOCUMENTS

JP     2004134672 A  *  4/2004  ....... H01L 27/14618
JP     2006-222164 A     8/2006
(Continued)

OTHER PUBLICATIONS

International Search Report (PCT/ISA/210) issued in PCT Application No. PCT/JP2019/003169 dated Apr. 16, 2019 with English translation (four pages).
(Continued)

*Primary Examiner* — Mohammad M Choudhry
(74) *Attorney, Agent, or Firm* — Crowell & Moring LLP

(57) ABSTRACT

A method of manufacturing a semiconductor device, includes: preparing a support substrate having a peeling layer formed on a main surface side; partially forming a wiring layer above the peeling layer; arranging a semiconductor chip on the support substrate so that a pad of the semiconductor chip is electrically connected to the wiring layer; forming an encapsulating layer that encapsulates at least a part of the wiring layer and the semiconductor chip and is in contact with the peeling layer or a layer above the peeling layer so as to form an intermediate laminated body including the semiconductor chip, the wiring layer, and the encapsulating layer on the support substrate; cutting a peripheral portion of the support substrate after forming the intermediate laminated body; and mechanically peeling the intermediate laminated body from the support substrate with the peripheral portion cut away, with the peeling layer being as a boundary.

12 Claims, 8 Drawing Sheets

(52) U.S. Cl.
CPC ............... *H01L 2221/68386* (2013.01); *H01L 2924/182* (2013.01)

(56) References Cited

U.S. PATENT DOCUMENTS

2017/0256453 A1    9/2017   Yada et al.
2019/0013212 A1*   1/2019   Matsuura ................ G03F 7/164

FOREIGN PATENT DOCUMENTS

| JP | 2009-147270 A | 7/2009 |
| JP | 2010-251682 A | 11/2010 |
| JP | 2012-151260 A | 8/2012 |
| JP | 2016-134516 A | 7/2016 |
| JP | 2017-17238 A | 1/2017 |
| JP | 2017-162876 A | 9/2017 |
| JP | 6203988 B1 | 9/2017 |

OTHER PUBLICATIONS

Japanese-language Written Opinion (PCT/ISA/237) issued in PCT Application No. PCT/JP2019/003169 dated Apr. 16, 2019 (seven pages).

\* cited by examiner

METHOD OF MANUFACTURING SEMICONDUCTOR DEVICE

TECHNICAL FIELD

The present invention relates to a method of manufacturing a semiconductor device.

BACKGROUND ART

A so-called chip last type (RDL first type) semiconductor device is manufactured by steps of forming a wiring layer and an insulating layer on a temporary support substrate, which is temporarily used; arranging and molding a semiconductor chip; and then removing the temporary support substrate. The removal of the temporary support substrate is performed by mechanically peeling and separating the temporary support substrate from the molded semiconductor chip, the wiring layer, and the insulating layer (hereinafter, collectively referred to as an intermediate laminated body).

PTL1 discloses a method of manufacturing a printed wiring board (semiconductor device) using a carrier (support substrate) made of glass having an adhesive metal layer, a peeling layer, an antireflection layer, and an ultrathin copper layer on a surface.

CITATION LIST

Patent Literature

PTL1: Japanese Patent No. 6203988

SUMMARY OF INVENTION

Technical Problem

PTL1 discloses a method of peeling intermediate laminated bodies together, which are formed on a support substrate (carrier), from the support substrate across the entire surface of the support substrate.

However, it is difficult to form a wiring layer and an insulating layer having a stable film thickness in peripheral portions of the support substrate because of unstable film formation conditions. Additionally, it is necessary to bring a power supply mechanism (power supply electrode) in contact with the peripheral portions in an electroplating process for forming the wiring layer, which likely causes scratches and the like in the peripheral portions.

Therefore, when peeling is performed across the entire support substrate including the peripheral portions, uneven peeling may occur in the peripheral portions due to nonuniformity or scratches in the wiring layer and the insulating layer. The peeling unevenness in the peripheral portions adversely affects peeling of a central portion of the substrate on which the intermediate laminated bodies having the semiconductor chips and the wiring layer molded therein is formed. As a result, a yield of the intermediate laminated bodies and the semiconductor device including the intermediate laminated bodies may be reduced.

Solution to Problem (1) A method of manufacturing a semiconductor device according to the 1st aspect of present invention, comprises: preparing a support substrate having a peeling layer formed on a main surface side; partially forming a wiring layer above the peeling layer on the support substrate; arranging a semiconductor chip on the support substrate so that at least a part of a pad of the semiconductor chip is electrically connected to at least a part of the wiring layer; forming an encapsulating layer that encapsulates at least a part of the wiring layer and the semiconductor chip and is in contact with the peeling layer on the support substrate or a layer above the peeling layer so as to form an intermediate laminated body including the semiconductor chip, the wiring layer, and the encapsulating layer on the support substrate; cutting a peripheral portion of the support substrate after forming the intermediate laminated body; and mechanically peeling the intermediate laminated body from the support substrate with the peripheral portion cut away, with the peeling layer being as a boundary.

(2) The method of manufacturing a semiconductor device according to the 2nd aspect of the present invention is in the method according to the 1st aspect, wherein: cutting the peripheral portion of the support substrate preferably comprises: forming a planned splitting line in the peripheral portion of the support substrate; cutting the peeling layer and the encapsulating layer formed on the support substrate, from the main surface side of the support substrate at a position corresponding to the planned splitting line; and splitting the peripheral portion of the support substrate along the planned splitting line.

(3) The method of manufacturing a semiconductor device according to the 3rd aspect of the present invention is in the method according to the 2nd aspect, wherein: forming the planned splitting line is preferably performed by forming a score in a back surface of the support substrate.

(4) The method of manufacturing a semiconductor device according to the 4th aspect of the present invention is in the method according to the 3nd aspect, wherein: forming the score is preferably performed after forming the intermediate laminated body on the support substrate.

(5) The method of manufacturing a semiconductor device according to the 5th aspect of the present invention is in the method according to the 3nd aspect, wherein: forming the score is preferably performed before forming the wiring layer on the support substrate.

(6) The method of manufacturing a semiconductor device according to the 6th aspect of the present invention is in the method according to the 2nd aspect, wherein: forming the planned splitting line is preferably performed by forming a score in the main surface of the support substrate before forming the peeling layer.

(7) The method of manufacturing a semiconductor device according to the 7th aspect of the present invention is in the method according to the 2nd aspect, wherein: forming the planned splitting line is preferably performed by forming a weakened portion in the support substrate, the weakened portion having a strength lower than that of other portions.

(8) The method of manufacturing a semiconductor device according to the 8th aspect of the present invention is in the method according to any one of the 1st to 7th aspect, wherein: the support substrate is preferably a support substrate in which a metal layer, the peeling layer, and a thin copper layer are formed on the main surface in this order from the substrate side.

(9) The method of manufacturing a semiconductor device according to the 9th aspect of the present invention is in the method according to any one of the 1st to 7th aspect, wherein: forming the wiring layer is preferably performed a plurality of times to form a multilayer wiring type wiring layer.

(10) The method of manufacturing a semiconductor device according to the 10th aspect of the present invention is in the method according to any one of the 1st to 7th aspect, wherein the method preferably further comprises: forming a plurality of the intermediate laminated bodies in parallel on the support substrate; integrally peeling the plurality of intermediate laminated bodies formed in parallel from the support substrate; and cutting and separating the intermediate laminated bodies after the peeling.

(11) The method of manufacturing a semiconductor device according to the 11th aspect of the present invention is in the method according to any one of the 1st to 7th aspect, wherein: a plurality of the semiconductor chips are preferably arranged in the intermediate laminated body.

(12) The method of manufacturing a semiconductor device according to the 12th aspect of the present invention is in the method according to any one of the 1st to 7th aspect, wherein: a passive component is preferably arranged in the intermediate stacked body, together with the semiconductor chip.

Advantageous Effects of Invention

According to the present invention, intermediate laminated bodies can be stably peeled, regardless of unevenness or scratches of a film formed on peripheral portions of a support substrate.

BRIEF DESCRIPTION OF DRAWINGS

FIG. 7A is a view illustrating a first modification. FIG. 7B is a view illustrating a second modification. FIG. 7C is a view illustrating a third modification.

DESCRIPTION OF EMBODIMENTS

First Embodiment

Figure 5A:
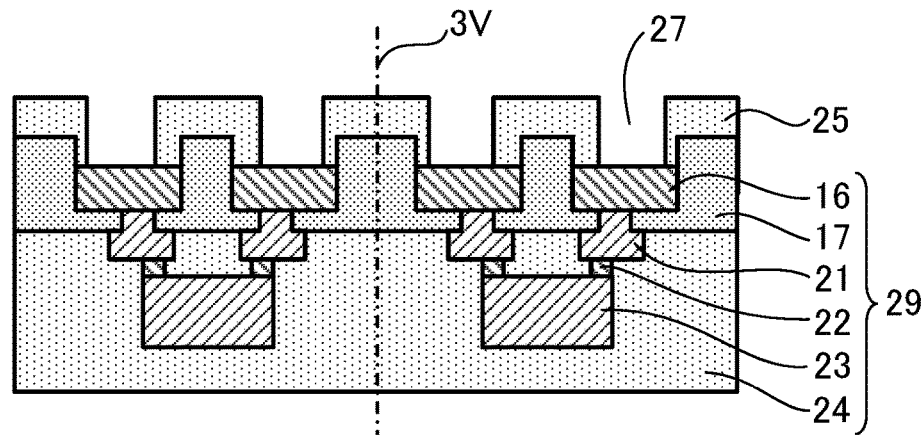
FIGS. 5A to 5C are views illustrating the method of manufacturing the semiconductor device according to the first embodiment of the invention, showing steps following the steps in FIGS. 4A and 4B.
Figure 5B:
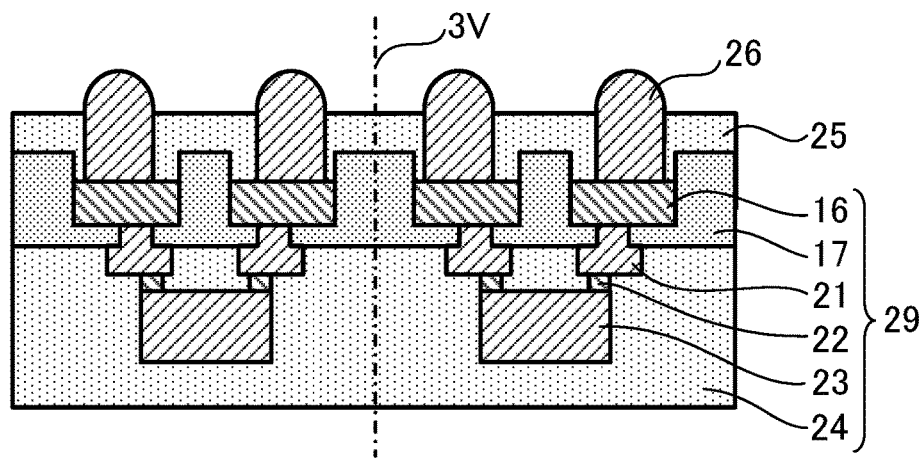
Figure 5C:
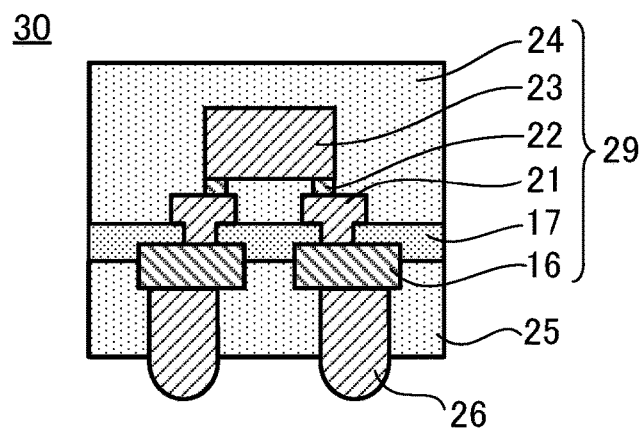
Figure 6:
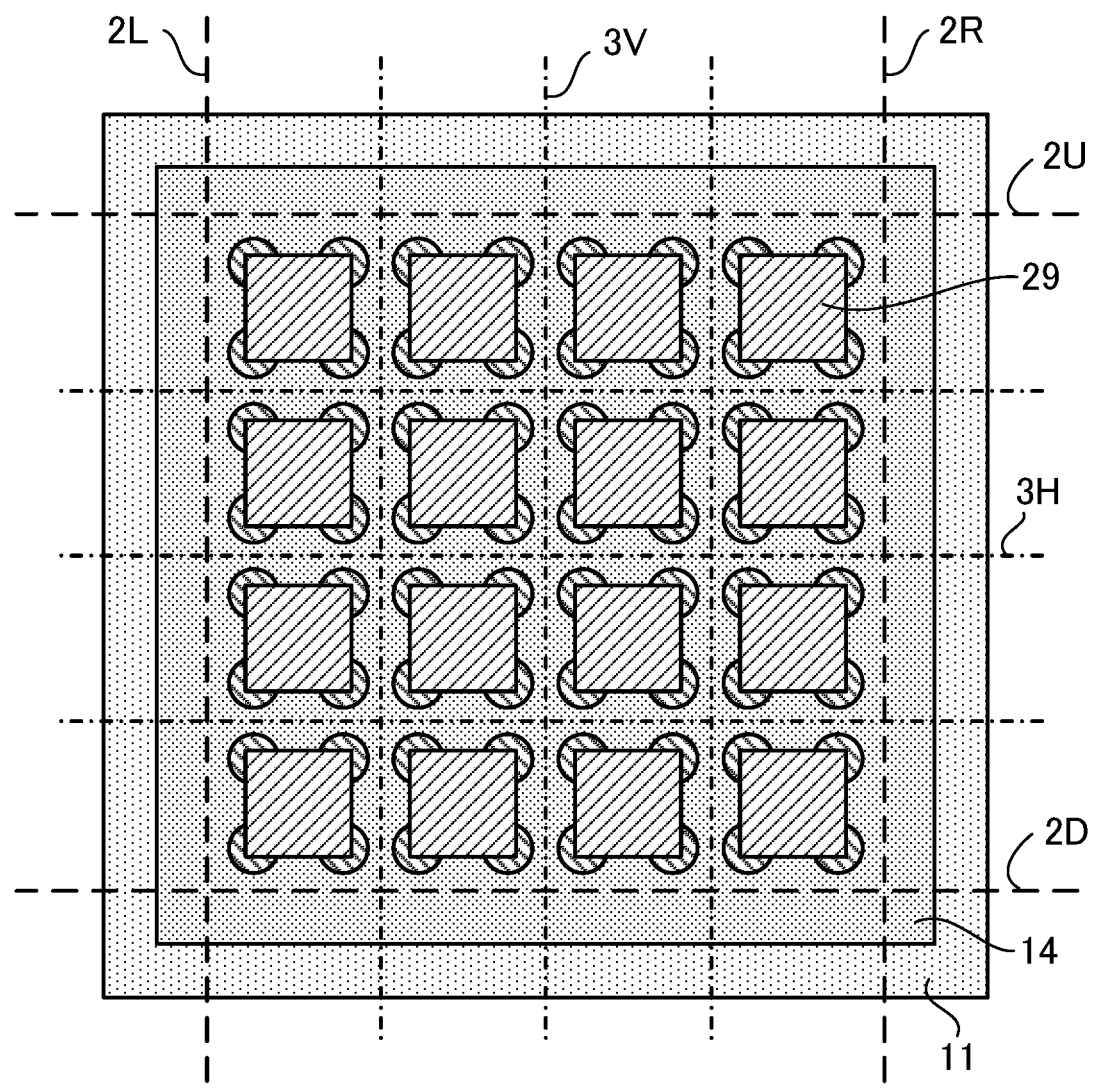
FIG. 6 is a view illustrating the method of manufacturing the semiconductor device according to the first embodiment of the present invention, showing a state where a plurality of intermediate laminated bodies are formed in parallel on the support substrate.

FIGS. 1 to 6 are views illustrating a method of manufacturing a semiconductor device 30 according to a first embodiment of the present invention. FIGS. 1 to 5 are cross-sectional views illustrating steps for forming an intermediate laminated body 29 including a wiring layer 16, semiconductor chips 23, an encapsulating layer 24, and the like on a support substrate 11. FIG. 6 is a top view showing a state where a plurality of intermediate laminated bodies 29 are formed in parallel on the support substrate 11. Note that illustration of some members such as the encapsulating layer 24 described later is omitted in FIG. 6.

Overview of Manufacturing Process

Referring to FIG. 6, an overview of a manufacturing process in this example will be described.

As shown in FIG. 6, in this example, the support substrate 11 has a generally square shape having sides in a range of 100 to 300 mm. Further, in this example, as shown in FIG. 6, the plurality of intermediate laminated bodies 29 including the encapsulating layer, the semiconductor chips, and the wiring layer described later are formed in parallel on the support substrate 11.

Thereafter, peripheral portions of the support substrate 11 are cut away at positions of a left end cutting line 2L, a right end cutting line 2R, an upper end cutting line 2U, and a lower end cutting line 2D indicated by dashed lines in FIG. 6. The left end cutting line 2L, the right end cutting line 2R, the upper end cutting line 2U, and the lower end cutting line 2D are collectively referred to as cutting lines 2.

After cutting the peripheral portions, the plurality of intermediate laminated bodies 29 formed in parallel are peeled together from the support substrate 11. Then, each of the plurality of intermediate laminated bodies 29 formed in parallel is separated (diced) at positions of a plurality of vertical separating lines 3V and a plurality of horizontal separating lines 3H indicated by dashed-dotted lines in FIG. 6. The vertical separating lines 3V and the horizontal separating lines 3H are collectively referred to as separating lines 3.

The intermediate laminated body 29 is finished into a semiconductor device 30 through subsequent steps described later. The positions of the cutting lines 2 and intervals between the separating lines 3 are set in accordance with a size (area) of the semiconductor device 30.

Now, referring to FIGS. 1 to 5, steps for forming the intermediate laminated body 29 including the wiring layer 16, the semiconductor chips 23, the encapsulating layer 24, and the like on the support substrate 11 and steps for forming the semiconductor device 30 will be described.

Support Substrate

Figure 1A:
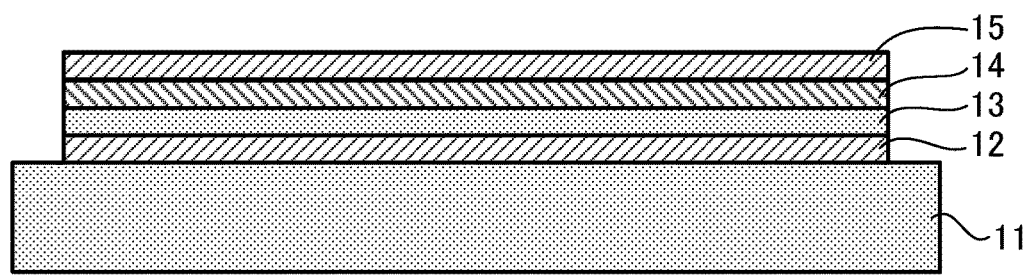
FIGS. 1A to 1C are views illustrating a method of manufacturing a semiconductor device according to a first embodiment of the present invention, showing a first half of the process.

FIG. 1(a) is a view showing a cross-sectional structure of a support substrate 11 in an initial stage of the manufacturing process. The support substrate 11 has the same configuration as that of a copper foil with a carrier disclosed in Japanese Patent No. 6203988. The support substrate 11 itself is made of glass and has an adhesive metal layer 12, a peeling layer 13, an antireflection layer 14, and a thin copper layer 15 formed on a main surface of the support substrate 11 (a surface on the front side, i.e., the upper surface in the figure), in this order from the substrate side. Materials and thicknesses of the above-described layers may be the same as those of the copper foil with a carrier disclosed in Japanese Patent No. 6203988.

That is, the support substrate 11 itself is made of glass, preferably having a thickness of 100 to 2000 µm.

The adhesive metal layer 12 is preferably a layer made of at least one metal selected from the group consisting of Ti, Cr, and Ni and may be a pure metal or an alloy, from the viewpoint of ensuring close adherence with the support substrate 11.

The thickness of the adhesive metal layer 12 is preferably in a range of 10 to 300 nm.

The peeling layer 13 is preferably a layer mainly containing carbon from the viewpoints of easy peeling, film forming property, and the like. The peeling layer 13 is more preferably a layer mainly consisting of carbon or hydrocarbon, or further preferably amorphous carbon, which is a hard carbon film. The thickness of the peeling layer 13 is preferably in a range of 1 to 20 nm.

The antireflection layer 14 is made of at least one metal selected from the group consisting of Cr, W, Ta, Ti, Ni, and Mo. The thickness of the antireflection layer 14 is preferably in a range of 10 to 300 nm. Note that the antireflection layer 14 may be omitted if an image inspection step is not necessary, because the antireflection layer 14 is provided to improve the accuracy of the image inspection of the wiring layer in the manufacturing process.

The thin copper layer 15 is a layer having copper as a main component and having a thickness in a range of 50 to 2000 nm. The thin copper layer 15 is preferably formed by vacuum deposition, sputtering, or plating.

The adhesive metal layer 12, the peeling layer 13, and the antireflection layer 14 are also preferably formed by sputtering or the like.

Further, a support substrate 11 having a peeling layer 13 and the like formed thereon, which satisfies the above-described conditions, may be purchased (i.e., prepared) and used, if commercially available.

Formation of Lower Pad

Figure 1B:
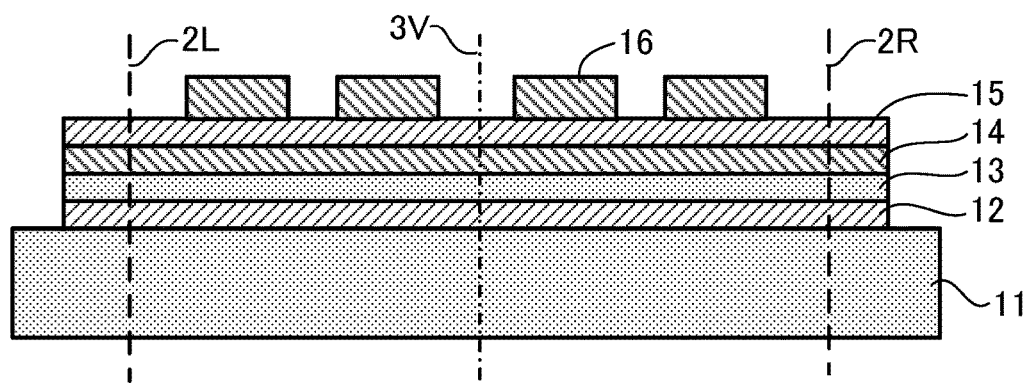

FIG. 1(b) shows a state where lower pads 16, which are to be parts of the semiconductor device 30, are formed on the thin copper layer 15 which is the uppermost layer on the support substrate 11. In forming the lower pads 16, a photoresist layer (not shown) is first formed on the entire surface of the thin copper layer 15, and a desired pattern corresponding to shapes of the lower pads 16 is then formed on the photoresist layer.

Thereafter, a power supply electrode is attached to the thin copper layer 15 on the support substrate 11 outside the cutting lines 2, and the support substrate 11 is immersed in a plating solution to perform electrolytic plating such as copper plating, so that the lower pads 16 are formed on portions where the thin copper layer 15 is exposed (that is, where the thin copper layer 15 is not covered with the photoresist). Then, the photoresist is removed.

FIG. 1(b) shows a state where the photoresist has been removed after forming the lower pads 16.

The thickness of the lower pad 16 is preferably in a range of 5 to 200 and the diameter of the lower pad 16 is preferably in a range of 30 to 200 μm. The shape of an upper surface of the lower pad 16 may be circle or polygon.

In order to improve adhesion between the lower pad 16 and an interlayer insulating film 17 described later, a front surface and side surfaces of the lower pad 16 may be roughened. Alternatively, a coupling agent may be provided to improve the adhesion between them.

Further, based on the above-described step, it is possible to form not only the lower pads 16, but also wiring for electrically connecting two different portions on the support substrate 11 by a pattern formed in a predetermined shape on the photoresist.

Figure 1C:
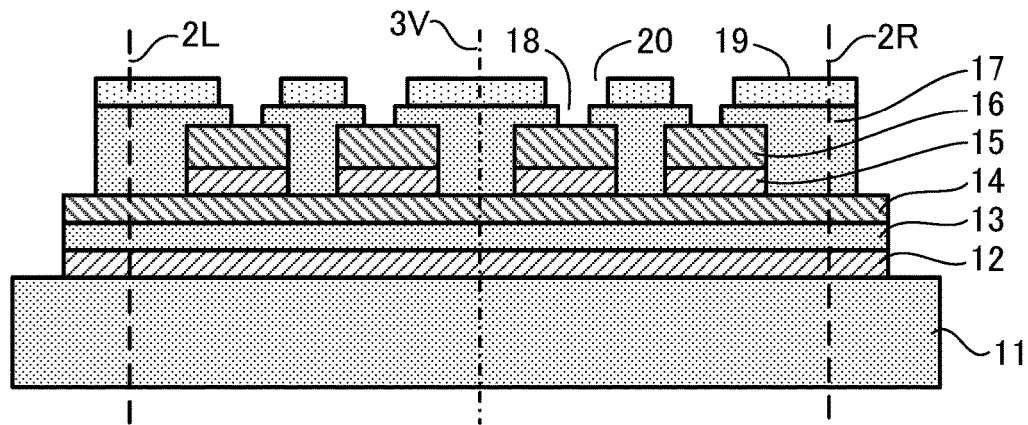

Formation of Interlayer Insulating Film FIG. 1(c) shows a state where the interlayer insulating film 17 is formed on the support substrate 11 so as to cover the lower pads 16, and a dry film resist 19 is formed thereon. As a material of the interlayer insulating film 17, an epoxy resin containing 80% or more of silicon filler is used, for example. The interlayer insulating film 17 is formed by a printing method, a compression molding method, or a method of laminating a sheet-like resin film under vacuum. After the formation, the interlayer insulating film 17 is cured to some extent.

After forming the interlayer insulating film 17 so as to cover the lower pads 16, through holes 18 for forming vias are formed at predetermined positions of the interlayer insulating film 17 by means of ablation by laser irradiation or the like. Subsequently, a desmear process is performed to remove residue resulting from the formation of the through holes. Then, a plating seed layer (not shown) made of metal such as copper is formed on the interlayer insulating film 17 having the through holes 18 formed therein, by electroless plating or sputtering.

Then, a dry film resist 19 is formed thereon, openings 20 are formed at predetermined positions in the dry film resist 19 that partially overlap the through holes 18 by means of ablation by laser irradiation or the like. FIG. 1(c) shows a state where the openings 20 are formed.

Formation of Upper Pad

A power supply electrode is attached to the above-described plating seed layer (not shown) formed on the interlayer insulating film 17 on the support substrate 11 outside the cutting lines 2. Then, the support substrate 11 is immersed in a plating solution to perform electrolytic plating such as copper plating, so that metal such as copper is deposited in the through holes 18 and the openings 20 to form vias and upper pads 21 (hereinafter, collectively referred to as upper pads 21).

Figure 2A:
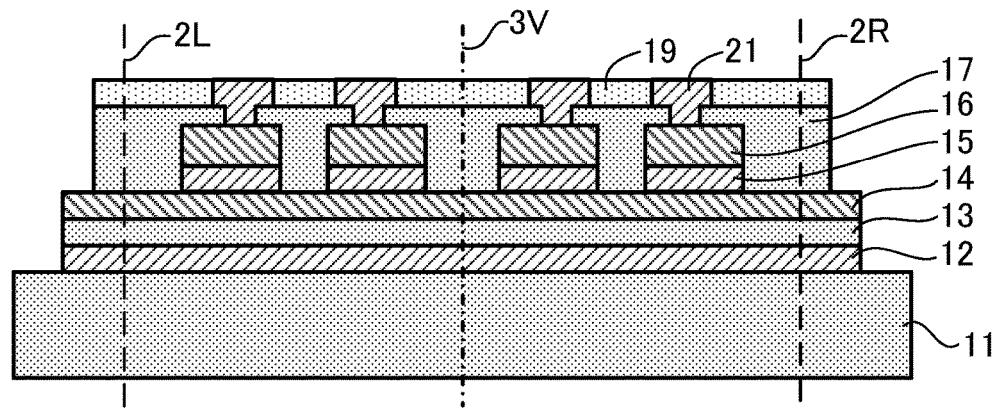
FIGS. 2A to 2C are views illustrating the method of manufacturing the semiconductor device according to the first embodiment of the present invention, showing steps following the steps in FIGS. 1A to 1C.

FIG. 2(a) shows a state where the upper pads 21 are formed in the through holes 18 and the openings 20.

Note that the lower pads 16 and the upper pads 21 may be referred to as wiring layers because they are both electrically conductive members.

Etching

Thereafter, the dry film resist 19 is removed and the interlayer insulating film 17 is then cured. The above-described plating seed layer (not shown) formed on the interlayer insulating film 17 is also removed (etched). The removal may be done by a known general method.

Bonding and Encapsulating of Semiconductor Chip

Figure 2B:
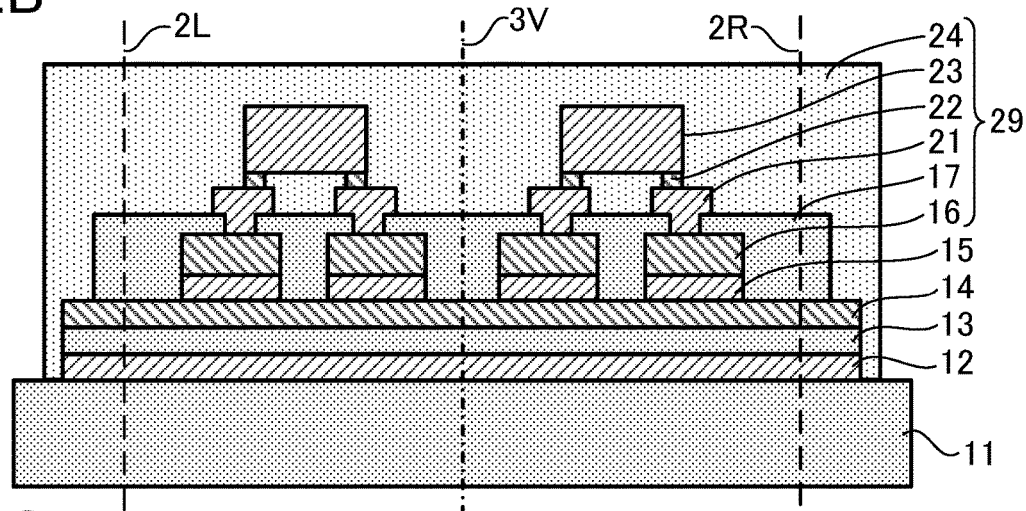

FIG. 2(b) shows that semiconductor chips 23 are bonded onto the laminate (the lower pads 16, the upper pads 21, and the interlayer insulating film 17) on the support substrate 11 formed as described above, and the semiconductor chips 23 are encapsulated with an encapsulating layer 24.

In bonding the semiconductor chips 23, soldered copper pillars 22 are formed in advance as electrode terminals for the semiconductor chips 23, and the semiconductor chips 23 are arranged so that each copper pillar 22 overlaps a predetermined upper pad 21. Then, the copper pillars 22 and the upper pads 21 are temporarily fixed with a fluxing agent, and thereafter C4 (Controlled Collapse Chip Connection) bonding is performed.

The copper pillars 22 and the upper pads 21 may be bonded by ultrasonic bonding. Solder ball bumps or micro solder bumps may also be formed on the semiconductor chips 23, instead of the soldered copper pillars 22.

Thereafter, the encapsulating layer 24 made of resin is formed by a compression molding method or the like so as to cover the semiconductor chips 23 and the main surface (the upper surface in FIG. 2(b)) of the support substrate 11. The encapsulating layer 24 also covers the lower pads 16, the upper pads 21, and the upper surface and side surfaces of the interlayer insulating film 17, as well as the peeling layer 13 formed on the support substrate 11 or the antireflection layer 14 on the peeling layer 13.

Through the above-described steps, the intermediate laminated bodies 29 including the encapsulating layer 24, the semiconductor chips 23, the copper pillars 22, the wiring layer (the upper pads 21 and the lower pads 16), and the interlayer insulating film 17 are formed on the support substrate 11.

Cutting of Peripheral Portion of Support Substrate

After forming the intermediate laminated bodies 29, peripheral portions of the support substrate 11 are cut. That is, portions of the support substrate 11 outside the above-described cutting lines 2 shown in FIG. 6 are cut.

Figure 2C:
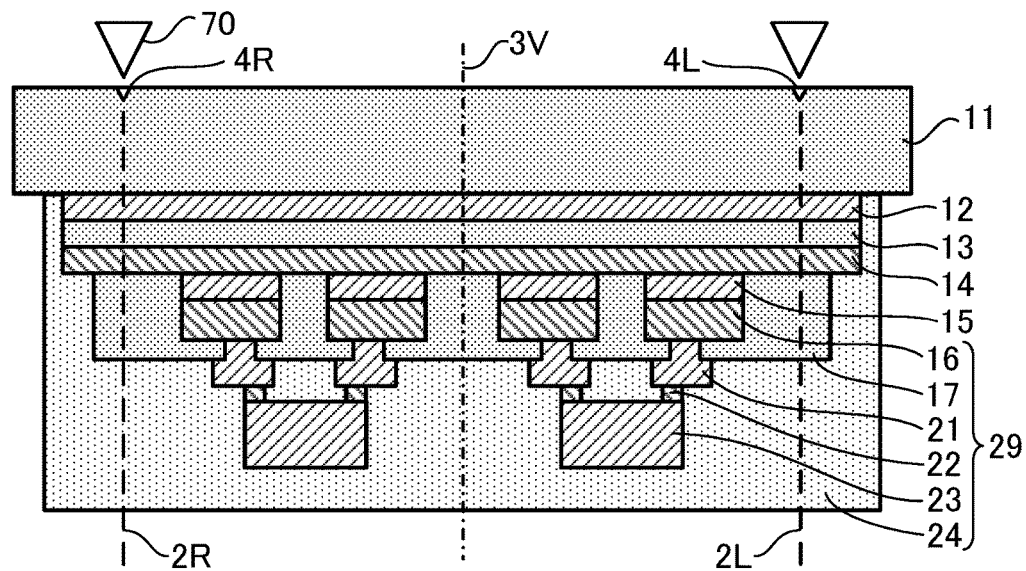

FIG. 2(c) shows the support substrate 11 arranged so that the main surface, on which the intermediate laminated bodies 29 have been formed, faces downward to cut the peripheral portions. Note that in FIG. 2(b) and FIG. 2(c), the positional relationship between the right end cutting line 2R and the left end cutting line 2L is inversed because the support substrate 11 is rotated by 180 degrees about a line perpendicular to the sheet plane.

In cutting the peripheral portions, first, a scribing wheel 70 creates scores 4R, 4L or minute scratches at positions corresponding to the right end cutting line 2R and the left end cutting line 2L on a back surface of the support substrate 11 (a surface opposite to the above-described main surface).

Similarly, scores are also created at positions corresponding to the upper end cutting line 2U and the lower end cutting line 2D on the back surface of the support substrate 11.

Figure 3A:
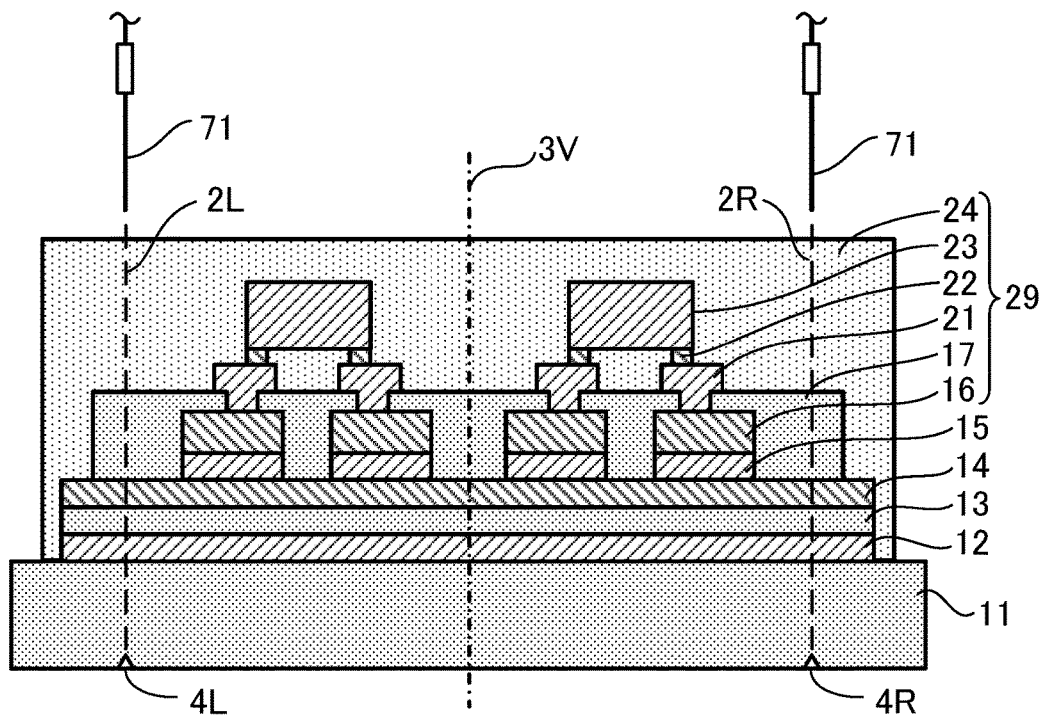
FIGS. 3A and 3B are views illustrating the method of manufacturing the semiconductor device according to the first embodiment of the invention, showing steps following the steps in FIGS. 2A to 2C.

FIG. 3(a) shows the support substrate 11 arranged upside down after cutting the peripheral portions. After cutting the peripheral portions, the laminate such as the encapsulating layer 24 on the main surface side of the support substrate 11 is cut at positions corresponding to the left end cutting line 2L and the right end cutting line 2R using a dicing saw 71.

Similarly, the laminate such as the encapsulating layer 24 on the main surface side of the support substrate 11 is cut at positions corresponding to the upper end cutting line 2U and the lower end cutting line 2D.

Cutting by the dicing saw 71 is aimed at the encapsulating layer 24, the interlayer insulating film 17, the antireflection layer 14, the peeling layer 13, and the adhesive metal layer 12, but cutouts may be partially formed near the main surface of the support substrate 11. Since the cut laminate is in close contact with the main surface in the peripheral portions of the support substrate 11 (outside the cutting line 2), the laminate is not immediately separated from the support substrate 11 after cutting, as long as the peripheral portions of the support substrate 11 are connected to the support substrate 11.

By applying a impulsive force to the peripheral portions (outer peripheral portions outside the cutting line 2) of the support substrate 11 in this state, the support substrate 11 is split (broken) at the positions of the cutting lines 2.

Figure 3B:
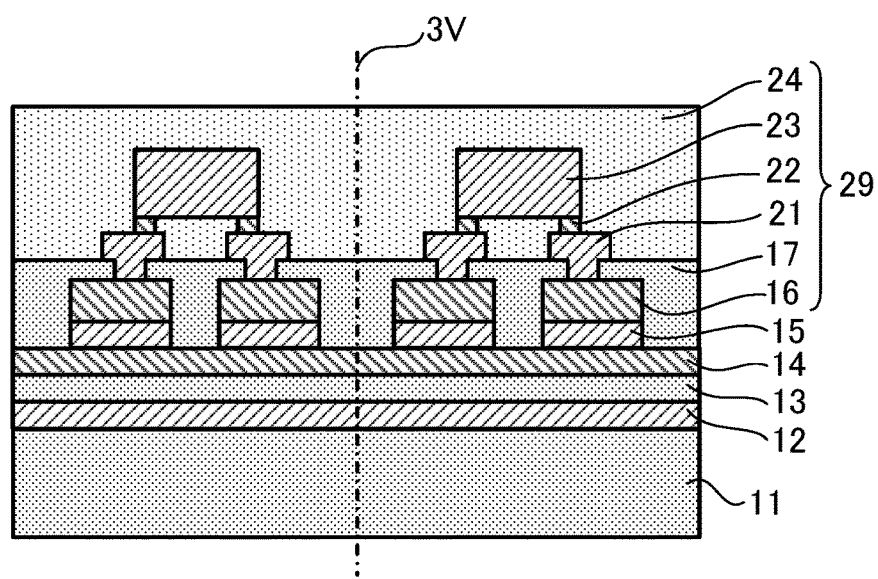

FIG. 3(b) shows the support substrate 11 and the intermediate laminated bodies 29 in a state where the peripheral portions are split away. As shown in FIG. 3(b), end portions of the peeling layer 13 are clearly exposed on the cut surfaces of the intermediate laminated bodies 29.

Note that the scores 4R, 4L are cracks that are formed to perform this splitting (breaking) and thus may also be regarded as planned splitting lines.

Peeling of Intermediate Laminated Bodies from Support Substrate

Figure 4A:
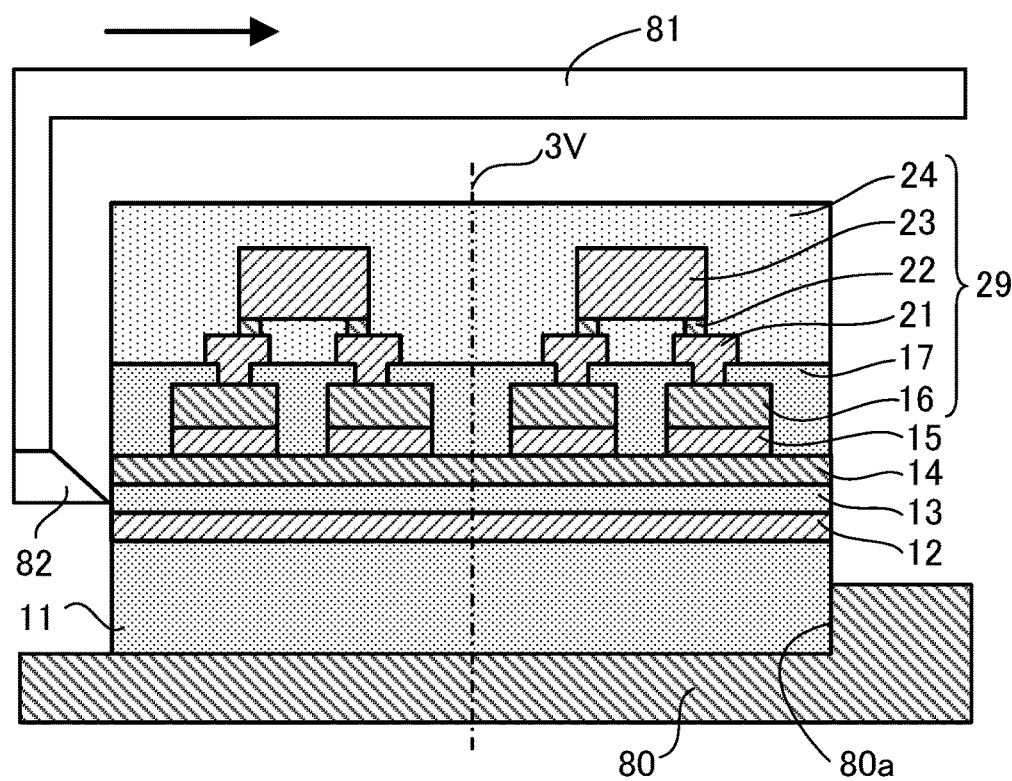
FIGS. 4A and 4B are views illustrating the method of manufacturing the semiconductor device according to the first embodiment of the invention, showing steps following the steps in FIGS. 3A and 3B.

FIG. 4(a) shows a state where the support substrate 11 and the intermediate laminated bodies 29, with peripheral portions thereof split away, are mounted on a peeling device (80, 81) to peel the intermediate laminated bodies 29 from the support substrate 11.

The peeling device is, for example, a device including a mounting table 80 on which the support substrate 11 is mounted, and a peeling arm 81 provided with a crack initiator 82 such as a needle.

Figure 4B:
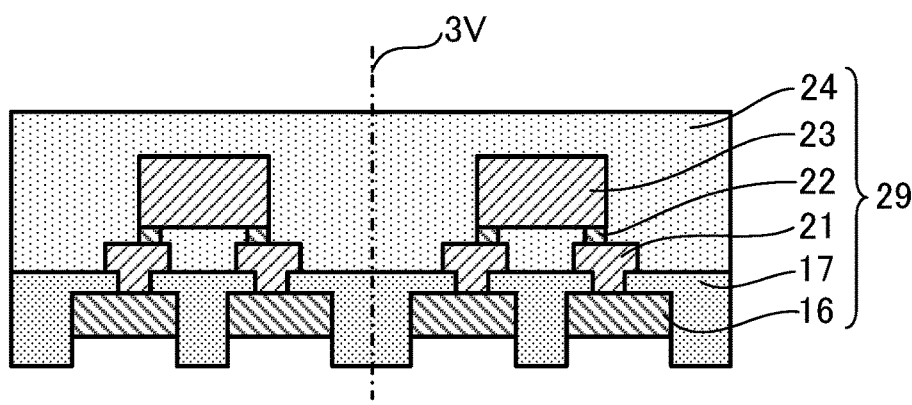

In peeling the intermediate laminated bodies 29, first, one end (the right end in FIG. 4(b)) of the support substrate 11 is fixed to a locking portion 80a on the mounting table 80. Then, a tip of the crack initiator 82 is brought into contact with the vicinity of the peeling layer 13 formed on the support substrate 11 and pushed into the support substrate 11 to form a peeling starting point. Then, by moving the peeling arm 81 relative to the mounting table 80 in the right direction in the figure, the intermediate laminated bodies 29 are peeled from the support substrate 11.

In this example, since the peeling layer 13 is formed between the support substrate 11 and the intermediate laminated bodies 29, the intermediate laminated bodies 29 can be uniformly peeled from the support substrate 11 with the peeling layer 13 as a boundary plane.

Then, debris of the peeling layer 13, the antireflection layer 14, and the thin copper layer 15 remaining on the peeling surface are removed from the intermediate laminated bodies 29 peeled from the support substrate 11.

FIG. 4(b) shows the intermediate laminated bodies 29, which have been peeled from the support substrate 11, after the debris of the peeling layer 13, the antireflection layer 14, and the thin copper layer 15 have been removed. For removing the debris of the peeling layer 13, the antireflection layer 14, and the thin copper layer 15, a known general removing method such as etching may be used.

Formation of Solder Balls

FIG. 5(a) shows a state where a solder resist 25 is formed on the interlayer insulating film 17 in order to form solder balls on the lower pads 16 of the intermediate laminated bodies 29, and openings 27 are formed in the solder resist 25 over the lower pads 16. In FIG. 5(a), the intermediate laminated body 29 is shown rotated (upside down) from the state shown in FIG. 4(b).

Thereafter, flux is applied onto the openings 27 of the solder resist 25, and the solder balls 26 are temporarily fixed on the lower pads 16. Then, reflow is performed to fix the solder balls 26.

FIG. 5(b) shows the intermediate laminated bodies 29 with the solder balls 26 fixed.

Dicing Thereafter, the plurality of intermediate laminated bodies 29, which are arranged in parallel (i.e., which are continuous with each other), are diced (singulated) using the dicing saw.

FIG. 5(c) shows the semiconductor device 30 in a finished state after being diced.

Note that, in each of FIGS. 1 to 5, a length in a thickness direction is enlarged relative to a length in an in-plane direction of the support substrate 11, for ease of explanation.

Additionally, in the above-described first embodiment, two intermediate laminated bodies 29 are formed on the left and right on the support substrate 11. However, the number of the intermediate laminated bodies 29 formed on the support substrate 11 is not limited thereto; a larger number of intermediate laminated bodies 29 may be formed.

Note that the above-described solder ball forming step may be omitted depending on uses of the semiconductor device 30 to be manufactured.

MODIFICATION

Referring to FIG. 7, first to fourth modifications will now be described.

The following modifications relate to a way of cutting the support substrate 11. Thus, the description of steps except for the way of cutting the support substrate 11 is omitted because they are the same as those in the above-described first embodiment.

First Modification

FIG. 7(*a*) shows a support substrate 11*a* used in a first modification.

As is the case with the support substrate 11 used in the above-described first embodiment, the support substrate 11*a* has an adhesive metal layer 12, a peeling layer 13, an antireflection layer 14, and a thin copper layer 15 formed on its main surface, in this order from the substrate side. However, scores 4*a*L and 4*a*R are formed in advance on the back surface (the surface opposite to the main surface) at positions corresponding to cutting lines 2 such as the left end cutting line 2L and the right end cutting line 2R.

Therefore, in the first modification, it is possible to omit the step of forming scores in the back surface of the support substrate 11*a* in the manufacturing process of the semiconductor device (for example, see Fig. (c)).

The scores 4*a*L and 4*a*R may be formed before the adhesive metal layer 12, the peeling layer 13, the antireflection layer 14, and the thin copper layer 15; or vice versa. However, the scores 4*a*L and 4*a*R are preferably formed before the wiring layer (the lower pads 16) is formed on the support substrate 11*a*.

Note that the scores 4*a*L and 4*a*R in the first modification can also be regarded as planned splitting lines, as is the case with the scores 4L and 4R in the above-described first embodiment.

Second Modification

FIG. 7(*b*) shows a support substrate 11*b* used in a second modification.

In the second modification, scores 4*b*L and 4*b*R are formed in advance at positions corresponding to cutting lines 2 such as the left end cutting line 2L and the right end cutting line 2R on the main surface of the support substrate 11*b*. Thereafter, an adhesive metal layer 12, a peeling layer 13, an antireflection layer 14, and a thin copper layer 15 are formed on the main surface of the support substrate 11*b* in this order from the substrate side, although they are not shown.

The scores formed on the main surface of the support substrate 11*b* also function as starting points for splitting (breaking), as is the case with the scores formed on the back surface. Thus, also in the second modification, the step of forming scores in the back surface of the support substrate 11*b* may be omitted in the manufacturing process of the semiconductor device.

Note that the scores 4*b*L and 4*b*R in the second modification can also be regarded as planned splitting lines, as is the case with the scores 4L and 4R in the above-described first embodiment.

Third Modification

FIG. 7(*c*) shows a support substrate 11*c* used in a third modification.

As is the case with the support substrate 11 used in the above-described first embodiment, the support substrate 11*c* has an adhesive metal layer 12, a peeling layer 13, an antireflection layer 14, and a thin copper layer 15 formed on its main surface, in this order from the substrate side. Here, at positions corresponding to the cutting lines 2 such as the left end cutting line 2L and the right end cutting line 2R in the support substrate 11*c*, weakened portions 4*c*L and 4*c*R having a lower strength than that of other portions are formed in advance.

The weakened portions 4*c*L and 4*c*R can be formed, for example, by focusing and irradiating a laser on portions to be weakened of the support substrate 11*c* made of glass.

The weakened portions 4*c*L and 4*c*R function as starting points for splitting (breaking). Thus, also in the third modification, the step of forming scores in the back surface of the support substrate 11*c* may be omitted in the manufacturing process of the semiconductor device.

Note that the weakened portions 4*c*L and 4*c*R in the third modification can also be regarded as planned splitting lines, as is the case with the scores 4L and 4R in the above-described first embodiment.

Fourth Modification

In a fourth modification, in cutting the peripheral portions of the support substrate 11, the support substrate 11 is not split by providing scores; instead, the entire support substrate 11 is cut using a dicing saw.

Therefore, in the fourth modification, as compared with the above-described first embodiment and the modifications, the step of forming scores (for example, see FIG. 2(*c*)) and the step of splitting may be omitted, so that the cutting step can be simplified.

Advantageous Effects of First Embodiment and First to Fourth Modifications

According to the above-described first embodiment and first to fourth modifications, the following advantageous effects can be obtained.

(1) A method of manufacturing a semiconductor device 30 according to the embodiment, includes: preparing a support substrate 11 having a peeling layer 13 formed on a main surface side; partially forming a wiring layer (lower pads 16, upper pads 21) above the peeling layer 13 on the support substrate 11; arranging a semiconductor chip 23 on the support substrate 11; forming an encapsulating layer 24 that encapsulates at least a part of the wiring layer (the lower pads 16, the upper pads 21) and the semiconductor chip 23 and is in contact with the peeling layer 13 on the support substrate 11 or a layer above the peeling layer 13 so as to form an intermediate laminated body 29 including the semiconductor chip 23, the wiring layer 16, 21, and the encapsulating layer 24 on the support substrate 11; cutting a peripheral portion of the support substrate 11 after forming the intermediate laminated body 29; and mechanically peeling the intermediate laminated body 29 from the support substrate 11 with the peripheral portion cut away, with the peeling layer 13 being as a boundary. With this manufacturing method, even if film formation unevenness or scratches due to contact of the electroplating electrode occur in the peripheral portions of the support substrate 11, the adverse effects thereof do not occur on the central portion of the support substrate 11, so that the intermediate laminated bodies 29 can be stably peeled from the support substrate 11. As a result, a yield of the intermediate stacked bodies 29 and the semiconductor device including the intermediate stacked bodies can be improved.

(2) Further, the cutting of the peripheral portions of the support substrate 11 may be performed by forming planned splitting lines in the peripheral portions of the support substrate 11; cutting the peeling layer 13 and the encapsulating layer 24 formed on the support substrate 11 at positions corresponding to the planned splitting lines, from the main surface side of the support substrate 11; and splitting the peripheral portions of the support substrate 11 along the planned splitting lines. In this way, the peripheral portions of the support substrate 11 can be more stably cut away, so that the yield can be further improved.

(3) Further, the support substrate 11 may be configured as a support substrate on which the metal layer 12, the peeling layer 13, and the thin copper layer 14 are formed on its main surface in this order from the substrate side. This achieves more stable peeling from the peeling layer 13.

(4) The method may further include forming a plurality of the intermediate laminated bodies 29 in parallel on the support substrate 11; integrally peeling the plurality of intermediate laminated bodies 29 formed in parallel from the support substrate 11; and cutting and separating the intermediate laminated bodies 29 after the peeling. In this way, a manufacturing method with a high production efficiency can be realized.

Second Embodiment

Figure 8A:
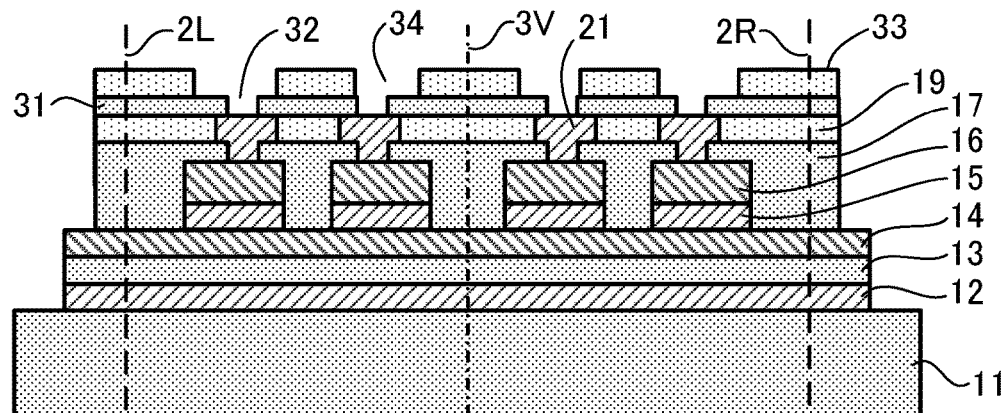
FIGS. 8A to 8C are views illustrating a method of manufacturing a semiconductor device according to a second embodiment of the invention.
Figure 8B:
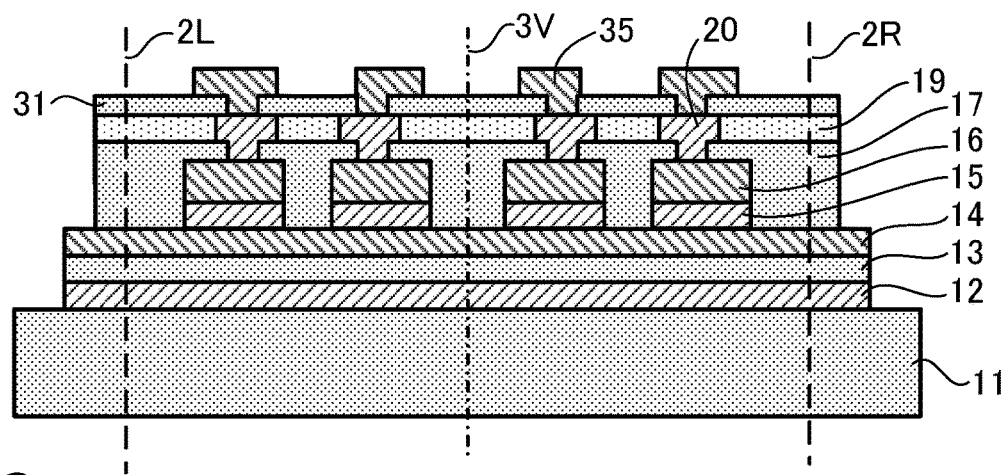
Figure 8C:
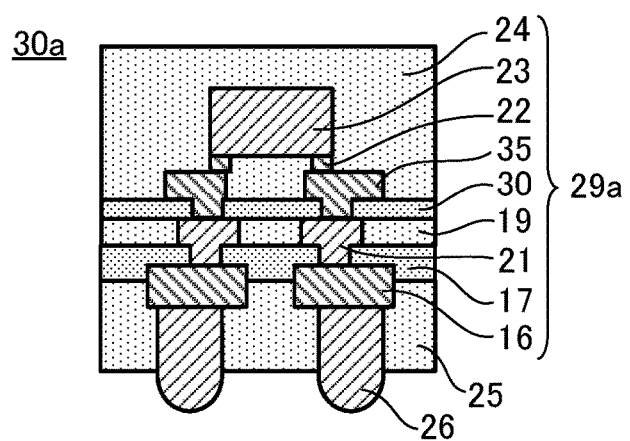

A second embodiment of the method of manufacturing a semiconductor device 30a will be described with reference to FIG. 8.

In the second embodiment, the number of wiring layers to be formed is three. Note that the manufacturing process of the second embodiment is the same as that of the first embodiment except for items described below.

In this modification, after the upper pads 21 are formed and the dry film resist 19 is removed as in the first embodiment described above (that is, after the dry film resist 19 is removed from the state shown in FIG. 2(a)), a second interlayer insulating film 31 is formed on the upper pads 21 and the interlayer insulating film 17, and through holes 32 are formed in predetermined portions of the second interlayer insulating film 31.

A seed layer (not shown) made of metal such as copper is formed on the second interlayer insulating film 31 having the through holes 32 formed therein, by electroless plating or sputtering.

Figure 7A:
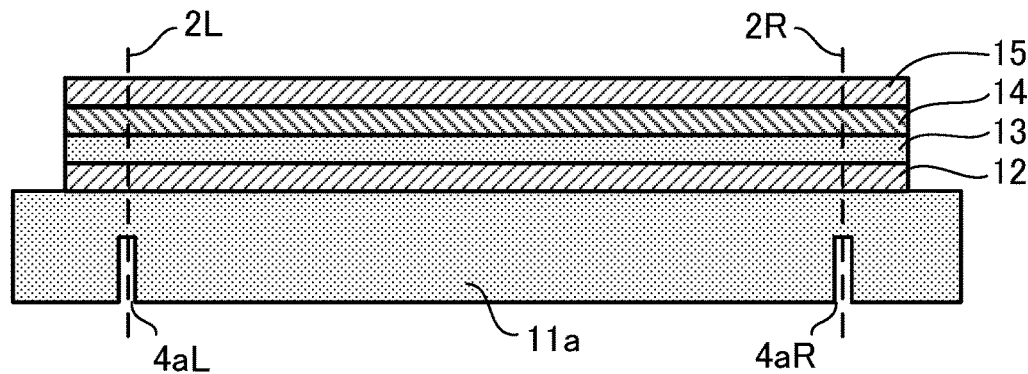
FIGS. 7A to 7C are views illustrating methods of manufacturing a semiconductor device according to first to third modifications.

Then, a dry film resist 33 is formed thereon, openings 34 are formed at predetermined positions in the dry film resist 33. FIG. 7(a) shows a state where the openings 34 are formed.

Then, electrolytic plating such as copper plating is performed, so that metal such as copper is deposited in the through holes 32 and the openings 34 to form the uppermost pads 35. Note that the uppermost pads 35 may also be regarded as parts of the above-described wiring layer because they are also electrically conductive members.

Thereafter, the dry film resist 33 is removed and the second interlayer insulating film 31 is then cured. The above-described plating seed layer (not shown) formed on the second interlayer insulating film 31 is also removed (etched).

Figure 7B:
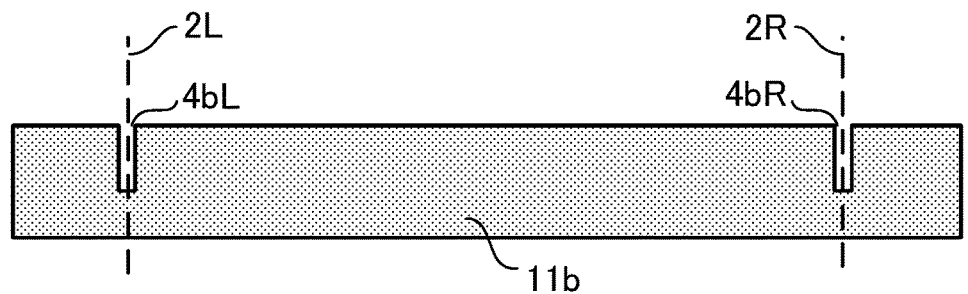

FIG. 7(b) shows a state where the uppermost pads 35 are formed and the dry film resist 33 is removed.

Figure 7C:
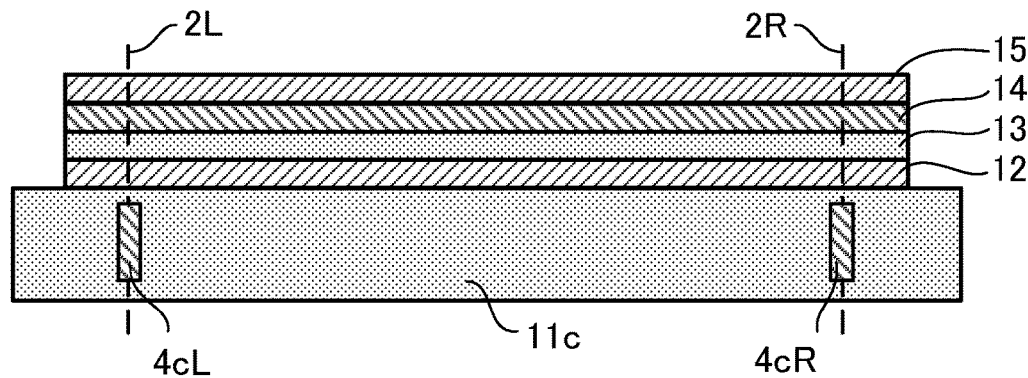

Thereafter, by performing the same steps as the step of "bonding and encapsulating the semiconductor chip" and subsequent steps illustrated in the above-described embodiment, the semiconductor device 30a having three wiring layers (the lower pads 16, the upper pads 21, and the uppermost pads 35) can be manufactured as shown in FIG. 7(c).

A semiconductor device having four or more wiring layers can be manufactured by further adding steps to the second embodiment, wherein the steps are similar to the steps that are added to the first embodiment to provide the second embodiment.

Advantageous Effect of Second Embodiment

In addition to the advantageous effects obtained by the first embodiment and first to fourth modifications described above, the manufacturing method in the second embodiment described above has an advantageous effect of manufacturing a semiconductor device having three wiring layers with a high yield. [0053] In each of the embodiments and modifications described above, the support substrate 11 itself is made of glass. However, the support substrate 11 itself may be a substrate made of ceramics, resin, or metal. Further, the shape of the support substrate 11 is not limited to square, but may be another shape such as rectangle or circle.

Furthermore, the lower pads 16, the upper pads 21, and the uppermost pads 35 are not limited to copper, but may be other metals. Various photoresists may be photosensitive dry films or may be patterned by laser ablation.

Further, the number of semiconductor chip 23 arranged in each intermediate laminated body 29 is not limited to one. A plurality of semiconductor chips 23 may be arranged in one intermediate laminated body 29. As a result, higher-performance intermediate laminated bodies 29 and a higher-performance semiconductor device 30 can be realized.

Additionally, the electronic components arranged in each intermediate laminated body 29 are not limited to the semiconductor chips 23. Passive components such as capacitors, coils, and antennas may be arranged together with the semiconductor chips 23. As a result, it is possible to realize high-performance intermediate laminated bodies 29 and a high-performance semiconductor device 30 having functions that cannot be realized by the semiconductor chip 23 alone.

The present invention is not limited to the above description. Other aspects that are conceivable within the scope of the technical idea of the present invention are also included within the scope of the present invention.

The disclosure of the following priority application is herein incorporated by reference:

Japanese Patent Application No. 2018-019434 (filed on Feb. 6, 2018)

REFERENCE SIGNS LIST 30, 30a: semiconductor device, 11, 11a, 11b, 11c: support substrate, 12: metal layer, 13: peeling layer, 14: antireflection layer, 15: thin copper layer, 16: lower pad (wiring layer), 17: interlayer insulating film, 19: resist, 21: upper pad (wiring layer), 23: semiconductor chip, 24: encapsulating layer, 2: cutting line, 3: separating line, 29: intermediate laminated body

The invention claimed is:

1. A method of manufacturing a semiconductor device, comprising:
preparing a support substrate having a peeling layer formed on a main surface side;
partially forming a wiring layer above the peeling layer on the support substrate;

arranging a semiconductor chip on the support substrate so that at least a part of a pad of the semiconductor chip is electrically connected to at least a part of the wiring layer;

forming an encapsulating layer that encapsulates at least a part of the wiring layer and the semiconductor chip and is in contact with the peeling layer on the support substrate or a layer above the peeling layer so as to form an intermediate laminated body including the semiconductor chip, the wiring layer, and the encapsulating layer on the support substrate;

cutting a peripheral portion of the support substrate after forming the intermediate laminated body; and mechanically peeling the intermediate laminated body from the support substrate with the peripheral portion cut away, with the peeling layer being as a boundary, wherein the encapsulating layer is formed to be in direct contact with the main surface of the support substrate but not in contact with a surface of the support substrate other than the main surface of the support substrate, and wherein the encapsulating layer is formed to cover outermost side surfaces of the peeling layer.

2. The method of manufacturing a semiconductor device according to claim 1, wherein:

cutting the peripheral portion of the support substrate comprises:

forming a planned splitting line in the peripheral portion of the support substrate;

cutting the peeling layer and the encapsulating layer formed on the support substrate, from the main surface side of the support substrate at a position corresponding to the planned splitting line; and splitting the peripheral portion of the support substrate along the planned splitting line.

3. The method of manufacturing a semiconductor device according to claim 2, wherein:

forming the planned splitting line is performed by forming a score in a back surface of the support substrate.

4. The method of manufacturing a semiconductor device according to claim 3, wherein:

forming the score is performed after forming the intermediate laminated body on the support substrate.

5. The method of manufacturing a semiconductor device according to claim 3, wherein:

forming the score is performed before forming the wiring layer on the support substrate.

6. The method of manufacturing a semiconductor device according to claim 2, wherein:

forming the planned splitting line is performed by forming a score in the main surface of the support substrate before forming the peeling layer.

7. The method of manufacturing a semiconductor device according to claim 2, wherein:

forming the planned splitting line is performed by forming a weakened portion in the support substrate, the weakened portion having a strength lower than that of other portions.

8. The method of manufacturing a semiconductor device according to claim 1, wherein:

the support substrate is a support substrate in which a metal layer, the peeling layer, and a thin copper layer are formed on the main surface in this order from the substrate side.

9. The method of manufacturing a semiconductor device according to claim 1, wherein:

forming the wiring layer is performed a plurality of times to form a multilayer wiring type wiring layer.

10. The method of manufacturing a semiconductor device according to claim 1, further comprising:

forming a plurality of the intermediate laminated bodies in parallel on the support substrate;

integrally peeling the plurality of intermediate laminated bodies formed in parallel from the support substrate; and cutting and separating the intermediate laminated bodies after the peeling.

11. The method of manufacturing a semiconductor device according to claim 1, wherein:

a plurality of the semiconductor chips are arranged in the intermediate laminated body.

12. The method of manufacturing a semiconductor device according to claim 1, wherein:

a passive component is arranged in the intermediate stacked body, together with the semiconductor chip.

* * * * *